(12) United States Patent
Zhu

(10) Patent No.: US 9,461,113 B2
(45) Date of Patent: Oct. 4, 2016

(54) SEMICONDUCTOR ARRANGEMENTS AND METHODS OF MANUFACTURING THE SAME

(71) Applicant: INSTITUTE OF MICROELECTRONICS, CHINESE ACADEMY OF SCIENCES, Beijing (CN)

(72) Inventor: Huilong Zhu, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 14/397,463

(22) PCT Filed: Mar. 11, 2013

(86) PCT No.: PCT/CN2013/072412
§ 371 (c)(1),
(2) Date: Oct. 27, 2014

(87) PCT Pub. No.: WO2014/121536
PCT Pub. Date: Aug. 14, 2014

(65) Prior Publication Data
US 2015/0340438 A1    Nov. 26, 2015

(30) Foreign Application Priority Data

Feb. 8, 2013 (CN) .......................... 2013 1 0050106

(51) Int. Cl.
*H01L 29/06* (2006.01)
*H01L 29/49* (2006.01)
(Continued)

(52) U.S. Cl.
CPC ........... *H01L 29/0673* (2013.01); *B82Y 10/00* (2013.01); *H01L 21/7688* (2013.01); *H01L 29/0642* (2013.01); *H01L 29/161* (2013.01); *H01L 29/1608* (2013.01); *H01L 29/42356* (2013.01); *H01L 29/42364* (2013.01); *H01L 29/42372* (2013.01); *H01L 29/495* (2013.01); *H01L 29/4916* (2013.01); *H01L 29/4966* (2013.01); *H01L 29/66439* (2013.01); *H01L 29/66484* (2013.01); *H01L 29/66545* (2013.01); *H01L 29/775* (2013.01);
(Continued)

(58) Field of Classification Search
CPC ........... H01L 21/7688; H01L 29/0642; H01L 29/0673; H01L 29/495; H01L 29/66545; H01L 29/42356; H01L 29/7848; H01L 29/4916; H01L 29/78648; H01L 29/775; H01L 29/66484; H01L 29/66439; H01L 29/161; H01L 29/1608; H01L 29/42364; H01L 29/42372; H01L 29/4966
See application file for complete search history.

(56) References Cited

U.S. PATENT DOCUMENTS

| | | | | |
|---|---|---|---|---|
| 7,955,932 B2 * | 6/2011 | Suk | ......... | B82Y 10/00 257/24 |
| 8,063,450 B2 * | 11/2011 | Wernersson | ......... | B82Y 10/00 257/213 |

(Continued)

FOREIGN PATENT DOCUMENTS

| CN | 101894842 A | 11/2010 |
|---|---|---|
| CN | 102623321 A | 8/2012 |

*Primary Examiner* — Allan R Wilson
(74) *Attorney, Agent, or Firm* — Christensen Fonder P.A.

(57) ABSTRACT

Semiconductor arrangements and methods for manufacturing the same. The arrangement may include: a substrate; a back gate formed on the substrate; at least one pair of nanowires disposed on opposite sides of the back gate; and back gate dielectric layers interposed between the back gate and the respective nanowires.

12 Claims, 18 Drawing Sheets

(51) Int. Cl.
| | |
|---|---|
| *H01L 29/423* | (2006.01) |
| *H01L 29/161* | (2006.01) |
| *H01L 29/16* | (2006.01) |
| *H01L 29/66* | (2006.01) |
| *H01L 29/78* | (2006.01) |
| *H01L 21/768* | (2006.01) |
| *H01L 29/775* | (2006.01) |
| *B82Y 10/00* | (2011.01) |
| *H01L 29/786* | (2006.01) |
| *H01L 29/10* | (2006.01) |
| *H01L 23/485* | (2006.01) |

(52) U.S. Cl.
 CPC .... *H01L 29/7848* (2013.01); *H01L 29/78648* (2013.01); *H01L 29/78696* (2013.01); *H01L 23/485* (2013.01); *H01L 29/1087* (2013.01)

(56) References Cited

U.S. PATENT DOCUMENTS

| | | | |
|---|---|---|---|
| 8,350,328 B2 | 1/2013 | Ishigaki et al. | |
| 9,123,567 B2* | 9/2015 | Radosavljevic | H01L 21/823807 |
| 2008/0246021 A1* | 10/2008 | Suk | B82Y 10/00 |
| | | | 257/24 |
| 2010/0295021 A1 | 11/2010 | Chang et al. | |
| 2011/0315950 A1* | 12/2011 | Sleight | B82Y 10/00 |
| | | | 257/9 |
| 2013/0003434 A1 | 1/2013 | Lue et al. | |
| 2013/0270512 A1* | 10/2013 | Radosavljevic | H01L 21/823807 |
| | | | 257/9 |
| 2014/0001441 A1* | 1/2014 | Kim | H01L 29/0673 |
| | | | 257/29 |
| 2014/0084239 A1* | 3/2014 | Radosavljevic | H01L 29/0665 |
| | | | 257/12 |

* cited by examiner (a)

(b)

ically control its threshold voltage. Further, the fin becomes thinner and thinner with the continuous scaling down trend, and tends to collapse during manufacture.

SEMICONDUCTOR ARRANGEMENTS AND METHODS OF MANUFACTURING THE SAME

CROSS-REFERENCE TO RELATED APPLICATION(S)

This application is a National Phase application of PCT Application No. PCT/CN2013/072412, filed on Mar. 11, 2013, entitled "SEMICONDUCTOR ARRANGEMENTS AND METHODS OF MANUFACTURING THE SAME," which claimed priority to Chinese Application No. 201310050106.8, filed on Feb. 8, 2013. Both the PCT Application and the Chinese Application are incorporated herein by reference in their entirety.

TECHNICAL FIELD

The present disclosure relates to the semiconductor field, and particularly, to semiconductor arrangements comprising nanowires and methods of manufacturing the same.

BACKGROUND

To deal with challenges caused by continuous scaling down of semiconductor devices, such as short channel effects, various high-performance devices, such as Ultra Thin Buried oxide and Body (UTBB) and Fin Field Effect Transistor (FinFET) devices, are proposed.

The UTBB device utilizes an Extremely Thin-Semiconductor On Insulator (ET-SOI) substrates. The SOI substrate can suppress the short channel effects due to a Buried Oxide (BOX) therein. Further, a back gate may be disposed on a back side of the SOI substrate, to control a threshold voltage of the device, and thus to reduce power consumption of the device (by, for example, enhancing the threshold voltage when the device is off and thus reducing current leakage). However, the ET-SOI substrate is significantly expensive and has problems such as self-heating. Further, the ET-SOI substrate is more and more difficult to manufacture with the continuous scaling down trend.

The FinFET device is a 3D device, including a fin vertically formed on a substrate. A conductive channel may be formed in the fin. The fin may have its height increased while keeping its footprint unchanged, and thus may have an improved drive current per unit footprint. Further, the device can become a nanowire FET (nFET) when the fin is formed as a nanowire. However, the FinFET device cannot effectively control its threshold voltage. Further, the fin becomes thinner and thinner with the continuous scaling down trend, and tends to collapse during manufacture.

SUMMARY

The present disclosure provides, among others, semiconductor arrangements and methods for manufacturing the same.

According to an aspect of the present disclosure, there is provided a semiconductor arrangement, comprising: a substrate; a back gate formed on the substrate; at least one pair of nanowires disposed on opposite sides of the back gate; and back gate dielectric layers interposed between the back gate and the respective nanowires.

According to a further aspect of the present disclosure, there is provided a method of manufacturing a semiconductor arrangement, comprising: forming a stack of at least one sacrificial layer and at least one nanowire material layer which are arranged alternately on a substrate; forming a back gate groove in the stack; forming back gate dielectric layers on side walls of the back gate groove; forming a back gate by filling a conductive material into the back gate groove; and forming nanowires abutting the respective back gate dielectric layers by patterning the stack and selectively removing the sacrificial layer.

According to embodiments of the present disclosure, the back gate is disposed on the substrate, and holds at least one pair of nanowires on the opposite side walls thereof. As a result, the back gate and the nanowires constitute a sandwich nanowire (which is referred to in brief as "SN") configuration. Based on the SN configuration, various devices such as sandwich nanowire Field Effect Transistors (SNFETs) can be made. In such a SN based device, it is possible not only to effectively control a threshold voltage of the device by the back gate, but also to improve its reliability by the back gate serving as a support for the nanowires.

BRIEF DESCRIPTION OF THE DRAWINGS

The above and other objects, features, and advantages of the present disclosure will become apparent from following descriptions of embodiments with reference to the attached drawings, in which.

DETAILED DESCRIPTION

Figure 1:
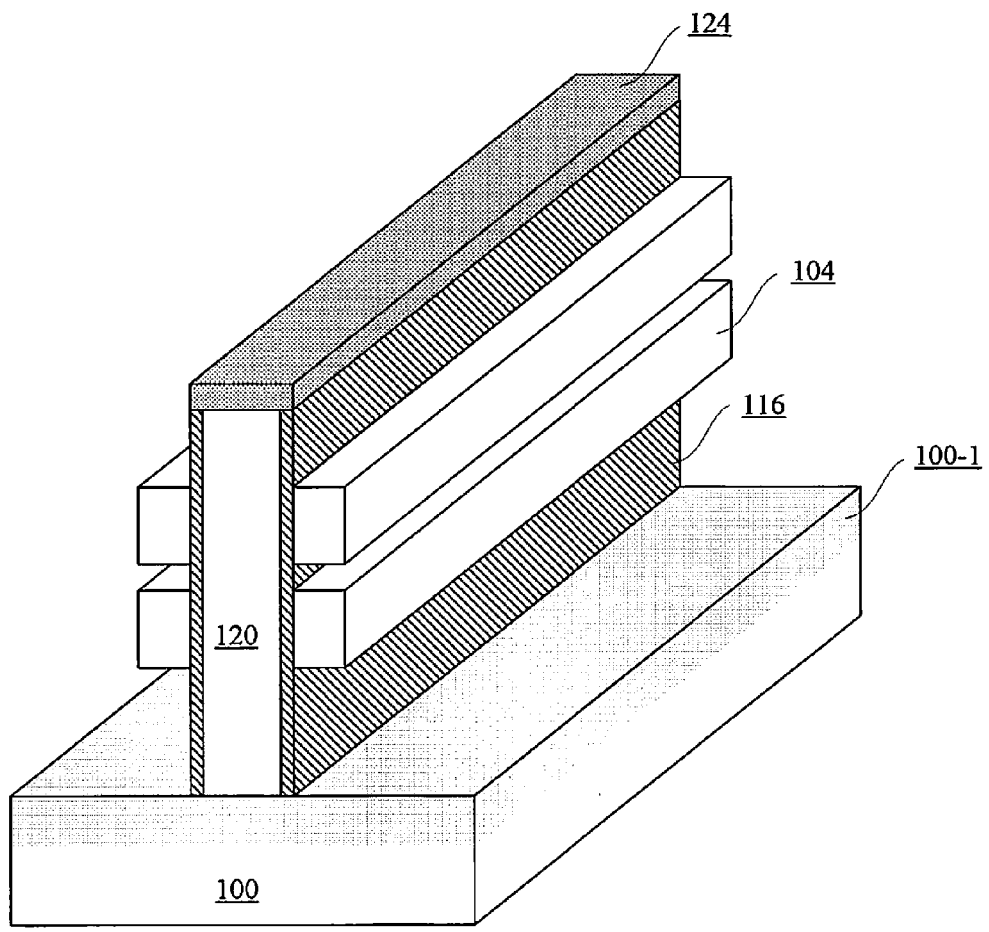
FIG. 1 is a perspective view showing a semiconductor arrangement according to an embodiment of the present disclosure.

Hereinafter, descriptions are given with reference to embodiments shown in the attached drawings. However, it is to be understood that these descriptions are illustrative and not intended to limit the present disclosure. Further, in the following, known structures and technologies are not described to avoid obscuring the present disclosure unnecessarily.

In the drawings, various structures according to the embodiments are schematically shown. However, they are not drawn to scale, and some features may be enlarged while some features may be omitted for sake of clarity. Moreover, shapes and relative sizes and positions of regions and layers shown in the drawings are also illustrative, and deviations may occur due to manufacture tolerances and technique limitations in practice. Those skilled in the art can also devise regions/layers of other different shapes, sizes, and relative positions as desired.

In the context of the present disclosure, when a layer/element is recited as being "on" a further layer/element, the layer/element can be disposed directly on the further layer/element, or otherwise there may be an intervening layer/element interposed therebetween. Further, if a layer/element is "on" a further layer/element in an orientation, then the layer/element can be "under" the further layer/element when the orientation is turned.

According to embodiments of the present disclosure, there is provided a semiconductor arrangement. The semiconductor arrangement may comprise a sandwich nanowire ("SN") configuration formed on a substrate. For example, the SN configuration comprises at least one pair of nanowires and a back gate interposed therebetween. The respective nanowires are spaced apart from the back gate by back gate dielectric layers. As a result, it is possible to control the nanowires by applying a bias to the back gate. Here, the so called "nanowire" may refer to a wire-like structure (for example, a structure whose sectional dimension is smaller than its extending length) in nanometer scale.

According to an embodiment of the present disclosure, the back gate may be in electrical contact with the substrate. Thus, it is possible to apply the bias to the back gate via the substrate. To improve an efficiency of applying the bias, a well region may be formed in the substrate so that the back gate is in electrical contact with the well region. The bias may be applied to the back gate through an electrical contact to the well region. To further reduce a contact resistance between the back gate and the well region, a contact region may be formed in the well region at a position corresponding to the back gate. The contact region may have a greater doping concentration than that of the well region.

According to embodiments of the present disclosure, various semiconductor devices such as SNFETs may be formed based on the SN. Though the SN comprises the back gate, it still looks like a fin as a whole. Therefore, existing FinFET manufacture processes and apparatuses are applicable to manufacture of SNFETs. There is no need to newly develop manufacture processes and apparatuses for application of the technology disclosed herein.

The SNFET may comprise a gate stack formed on the substrate and intersecting the SN. To electrically isolate the gate stack from the substrate, the SNFET may comprise an isolation layer formed on the substrate. The isolation layer can expose the nanowires included in the SN, while the gate stack may be disposed on the isolation layer. The gate stack defines a channel region (corresponding to a portion of each of the nanowires intersecting the gate stack) and thus source/drain regions (corresponding to portions of each of the nanowires on opposite sides of the channel region) in each of the nanowires. The gate stack may comprise a gate dielectric layer and a gate conductor layer formed on the gate dielectric layer. In an example, the gate conductor may extend on side surfaces of the respective nanowires opposite to the back gate, and thus control generation of conductive channels on the side surfaces via the gate dielectric layer. In addition, the gate conductor layer may further extend onto surfaces of the respective nanowires in a height direction of the back gate, and thus control generation of further conductive channels on the surfaces via the gate dielectric layer. To avoid interference between the gate stack and the back gate, they may have a dielectric layer disposed therebetween and thus be electrically isolated from each other.

According to embodiments, to improve the device performances, the strained source/drain technology may be applied. For example, the source/drain regions may comprise a semiconductor layer grown on surfaces of the nanowires and having a material different from that of the nanowires to apply stress to the channel regions. For example, for a p-type device, compressive stress may be applied; or for an n-type device, tensile stress may be applied.

According to embodiments of the present disclosure, the SN may be manufactured as follows. For example, a stack of at least one sacrificial layer and at least one nanowire material layer which are arranged alternately may be formed on a substrate. Then, a back gate groove may be formed in the stack, and a back gate may be formed by filling a conductive material, such as doped polysilicon, into the back gate groove. Before filling the back gate groove, back gate dielectric layers may be formed on side walls of the back gate groove. In an example, the back gate dielectric layers may be formed in a spacer formation process for simplification. Next, the stack may be patterned and the sacrificial layer may be selectively removed, to form nanowires abutting the respective back gate dielectric layers. For example, the stack may be patterned in such a manner that (wire-like) portions of the sacrificial layer and the nanowire material layer are left on the side walls of the back gate groove (specifically, on the respective back gate dielectric layers formed on the side walls of the back gate groove). Then, the sacrificial layer may be removed by selective etching, leaving the (wire-like) portions of the sacrificial layer there, which results in the nanowires.

For convenience of patterning of the back gate groove and the nanowires, in an example, a patterning auxiliary layer may be formed on the substrate. The patterning auxiliary layer may be patterned to have an opening at a position corresponding to the back gate groove, and a pattern transfer layer may be formed on side walls of the patterning auxiliary layer facing the opening. Thus, the patterning of the back gate groove (referred to as "first patterning" hereinafter) may be performed with the patterning auxiliary layer and the pattern transfer layer as a mask. Further, the patterning of the nanowires (referred to as "second patterning" hereinafter) may be performed with the pattern transfer layer as a mask.

In this way, the nanowires are formed by two times of patterning: the first patterning in which one side surface of each of the nanowires is formed, and the second patterning in which the other side surface of each of the nanowires is formed. During the first patterning, the nanowires are still connected to and thus are supported by the body of the substrate. Further, during the second patterning, the nanowires are connected to and thus are supported by the back gate. As a result, it is possible to prevent the nanowires from collapsing during their manufacture, and thus to manufacture the relatively thin nanowires at a greater yield.

Before the second patterning, a dielectric layer may be formed in the back gate groove to cover the back gate. The dielectric layer may electrically isolate the back gate (from, e.g., the gate stack) on one hand, and may prevent impacts of the second patterning on the back gate on the other hand.

Further, for convenience of patterning, in an example, the pattern transfer layer may be formed on the side walls of the patterning auxiliary layer in a spacer formation process. Because the spacer formation process needs no mask, it is possible to reduce a number of masks used in the manufacture.

According to an embodiment, the nanowire material layer may comprise any of Si, Ge, SiGe, GaAs, GaSb, AlAs, InAs, InP, GaN, SiC, InGaAs, InSb, or InGaSb, the sacrificial layer may comprise a material which has etching selectivity with respect to the nanowire material layer and the substrate, and the patterning auxiliary layer may comprise amorphous silicon. In this case, to avoid unwanted etching of the patterning auxiliary layer during the patterning of the back gate groove, a protection layer may be formed on a top surface of the patterning auxiliary layer. Further, before formation of the patterning auxiliary layer, a stop layer may be formed on the substrate. Patterning of the patterning auxiliary layer (to form the opening therein) may stop on the stop layer. For example, the protection layer may comprise nitride (e.g., silicon nitride), the pattern transfer layer may comprise nitride, and the stop layer may comprise oxide (e.g., silicon oxide).

Further, according to some embodiments of the present disclosure, after the SN is manufactured as described above, an SNFET may be manufactured. For example, an isolation layer may be formed on the substrate with the SN formed thereon in such a manner that the isolation layer exposes the respective nanowires of the SN. Then, a gate stack may be formed on the isolation layer in such a manner that the gate stack intersects the SN. Here, the gate last process is applicable.

The technology disclosed herein may be presented in various ways, some of which will be described in the following by way of example.

FIG. 1 is a perspective view showing a semiconductor arrangement according to an embodiment of the present disclosure. As shown in FIG. 1, the semiconductor arrangement comprises a substrate 100, such as a bulk semiconductor (e.g., Si) substrate, a compound semiconductor (e.g., SiGe) substrate, a Semiconductor on Insulator (SOI) substrate, or the like. In the following, the substrate is described as a bulk Si substrate for convenience. The semiconductor arrangement further comprises an SN configuration formed on the substrate. Specifically, the SN configuration may comprise pair(s) of nanowires 104 and a back gate 120 interposed between the nanowires.

The nanowires 104 each may comprise a material the same as or different from that of the substrate 100, for example, Si, Ge, SiGe, GaAs, GaSb, AlAs, InAs, InP, GaN, SiC, InGaAs, InSb, or InGaSb. The nanowires 104 each may have a height of about 3-15 nm and a width of about 3-28 nm. In FIG. 1, two pairs of nanowires 104 are shown. However, the present disclosure is not limited thereto. For example, there may be only one pair of nanowires, or three or more pairs of nanowires. The nanowires included in each pair may be disposed on opposite sides of the back gate, respectively. Further, in FIG. 1 the nanowires 104 are each shown as having a rectangular section. However, the present disclosure is not limited thereto. For example, the nanowires 104 each may have a section in various suitable shapes, such as regular or irregular polygons. Furthermore, in FIG. 1 the nanowires 104 are each shown to have planar surfaces. However, the present disclosure is not limited thereto. For example, the surfaces may be curved or rough, due to, for example, manufacture tolerances.

The nanowires 104 are separated from the back gate 120 by respective back gate dielectric layers 116. The back gate dielectric layers 116 each may comprise a suitable dielectric material, such as oxide (e.g., silicon oxide), with an equivalent oxide thickness (i.e., a dimension in a horizontal direction in the sheet) of about 2-30 nm. The back gate 120 may comprise a suitable conductive material, such as at least one of doped polysilicon, TiN, or W, with a width (i.e., a dimension in the horizontal direction in the sheet) of about 5-30 nm. The back gate 120 may be in electrical contact with the substrate 100. Thus, it is possible to apply a bias to the back gate 120 via the substrate 100. To do this, the substrate 100 may comprise a well region 100-1 to enhance the electrical contact with the back gate 120.

In the example of FIG. 1, the respective nanowires 104 are configured not to extend beyond the back gate 120 in a height direction (i.e., a vertical direction in the sheet) of the back gate 120. Thus, the back gate 120 can effectively control each of the nanowires 104 in its entire height (substantially corresponding to, for example, a channel width of an SNFET).

FIG. 1 also shows a dielectric layer 124 disposed on a top surface of the back gate 120. The dielectric layer 124 may comprise nitride (e.g., silicon nitride), and electrically isolate the back gate 120 from other components (e.g., a gate stack to be described later) formed on a front side (the upper side in FIG. 1) of the substrate.

Figure 2:
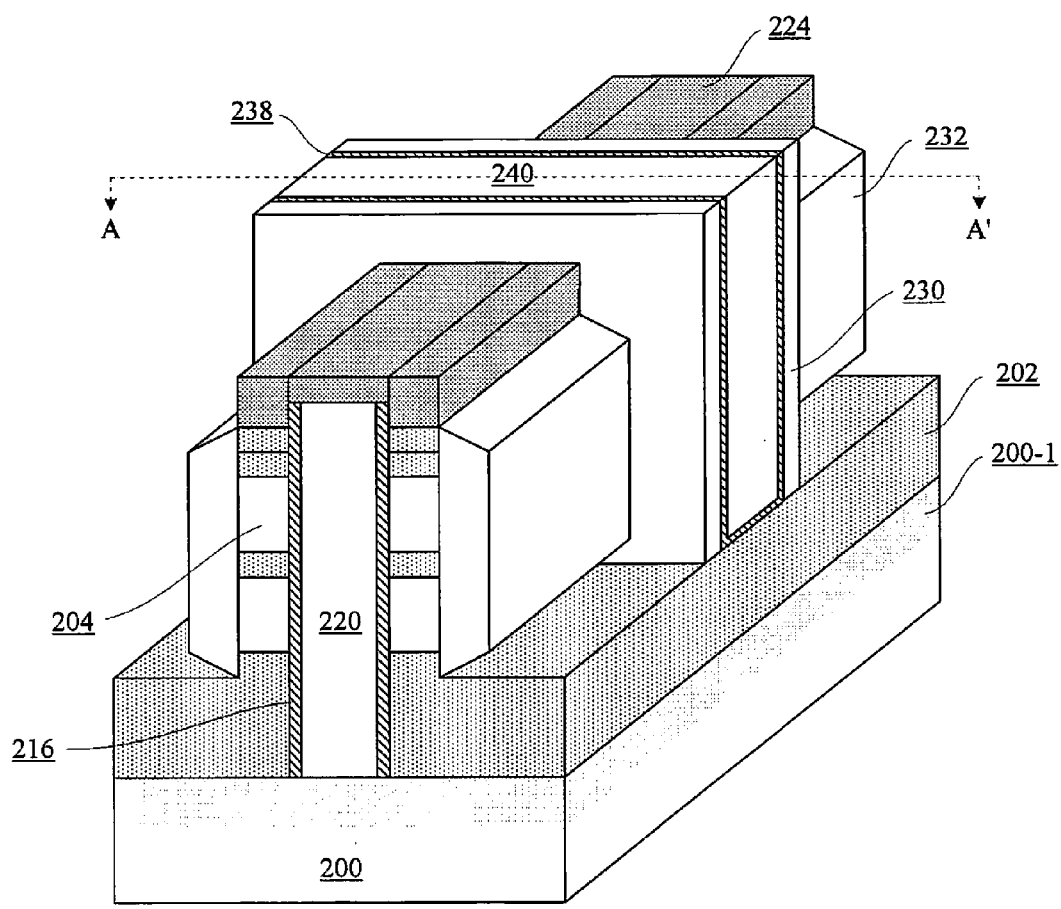
FIG. 2 is a perspective view showing a semiconductor arrangement according to a further embodiment of the present disclosure.
Figure 3:
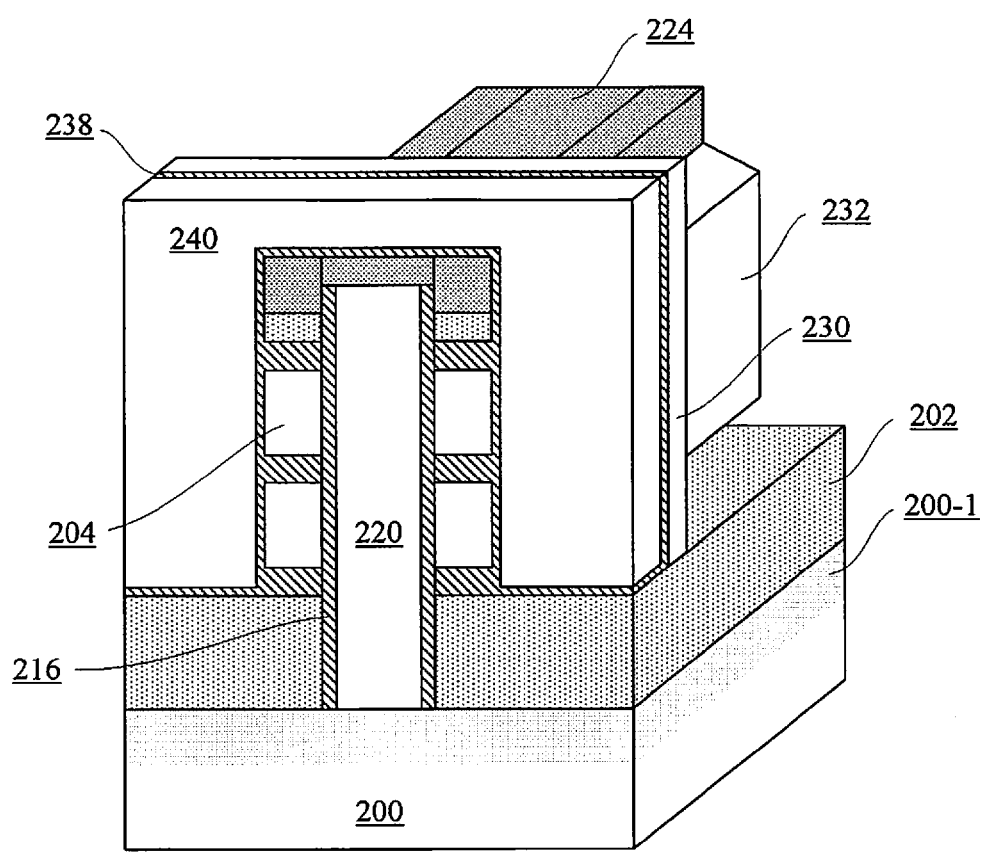
FIG. 3 is a perspective view showing the semiconductor arrangement of FIG. 2 which is cut off along AA'.

FIG. 2 is a perspective view showing a semiconductor arrangement according to a further embodiment of the present disclosure, and FIG. 3 is a perspective view showing the semiconductor arrangement of FIG. 2 which is cut off along AA'. Likewise, the semiconductor arrangement shown in FIGS. 2 and 3 comprises a substrate 200 and an SN formed on the substrate 200. Similarly to the embodiment shown in FIG. 1, the SN may comprise pair(s) of nanowires 204 and a back gate 220 interposed between the nanowires. The nanowires 204 are separated from the back gate 220 by respective back gate dielectric layers 216. To improve electrical contact between the back gate 220 and the substrate 200, the substrate 200 may comprise a well region 200-1. For structural parameters and materials of those elements, reference may be made to the above descriptions with reference to FIG. 1.

The semiconductor arrangement may further comprise an isolation layer 202 formed on the substrate 200 and a gate stack formed on the isolation layer 202 and intersecting the SN. For example, the isolation layer 202 may comprise oxide. The gate stack may comprise a gate dielectric layer 238 and a gate conductor layer 240. For example, the gate dielectric layer 238 may comprise a high-K dielectric material such as $HfO_2$, with a thickness of about 1-5 nm, and the gate conductor layer 240 may comprise a metal gate conductor. Further, the gate dielectric layer 238 may further comprise a thin oxide layer (on which the high-K gate dielectric layer is disposed), with a thickness of about 0.3-1.2 nm. A work function adjustment layer (not shown) may be disposed between the gate dielectric layer 238 and the gate conductor 240. Further, gate spacers 230 may be formed on opposite sides of the gate stack. For example, the gate spacers 230 each may comprise nitride, with a thickness of about 5-20 nm. The back gate 220 may be isolated from the gate stack by a dielectric layer 224 on a top surface thereof.

Due to the presence of the gate stack, a channel region (corresponding to a portion of each of the nanowires intersecting the gate stack) and source/drain regions (corresponding to portions of each of the nanowires on opposites sides of the channel region) are defined in the SN. In the semiconductor arrangement shown in FIG. 2, a semiconductor layer 232 may be further grown on surfaces of the nanowires in the source/drain regions. The semiconductor layer 232 may comprise a material different from that of the nanowires 204, to apply stress to the nanowires 204 (especially, the channel regions therein). For example, in a case where the nanowires 204 comprise Si, the semiconductor layer 232 may comprise Si:C (where an atomic percentage of C is about 0.2-2%, for example) for an n-type device to apply tensile stress, or SiGe (where an atomic percentage of Ge is about 15-75%, for example) for a p-type device to apply compressive stress. Further, the semiconductor layer 232 expands the source/drain regions, facilitating formation of contacts to the source/drain regions.

As shown in FIG. 3, the gate conductor layer 240 may extend on side surfaces of the nanowires 204 opposite to the back gate 220, so that the gate conductor layer 240 can control generation of conductive channels on these side surfaces of the nanowires 204 via the gate dielectric layer 238. In this example, gaps present at surfaces (i.e., upper and lower surfaces in FIG. 3) of the nanowires 204 in the height direction of the back gate are relatively small, and thus are filled up with the gate dielectric layer 238. According to another example, the gaps at the surfaces (i.e., upper and lower surfaces in FIG. 3) of the nanowires 204 in the height direction of the back gate may be set to be relatively great, so that the gate conductor layer 240 may further extend onto those surfaces. As a result, the gate conductor layer 240 may control generation of further conductive channels on those surfaces of the nanowires 204 via the gate dielectric layer 238.

In the example of FIGS. 2 and 3, some layers are shown on top of the nanowires 204. Those layers may be those left during manufacture of the semiconductor arrangement, and have no essential impacts on structural and operational features of the semiconductor arrangement. According to some embodiments of the present disclosure, those layers may be removed.

FIGS. 4-23 are schematic views showing a flow of manufacturing a semiconductor arrangement according to an embodiment of the present disclosure.

Figure 4:
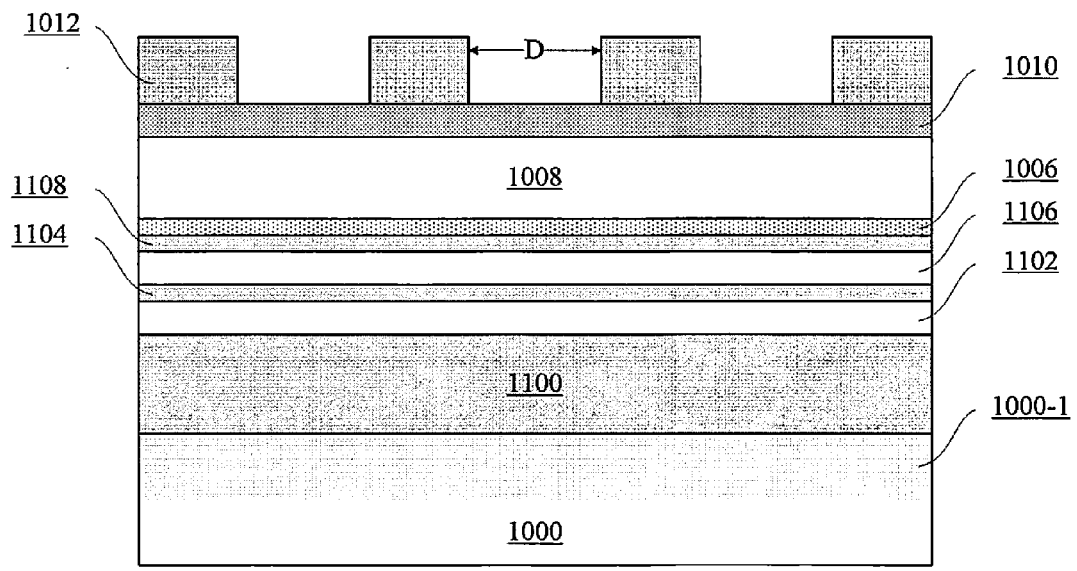
FIGS. 4-23 are schematic views showing a flow of manufacturing a semiconductor arrangement according to an embodiment of the present disclosure.

As shown in FIG. 4, a substrate 1000, such as bulk silicon substrate, is provided. A stack of alternating sacrificial layers and nanowire material layers may be formed on the substrate 1000. In the example shown in FIG. 4, a sacrificial layer 1100, a nanowire material layer 1102, a further sacrificial layer 1104, a further nanowire material layer 1106, and a still further sacrificial layer 1108 are formed sequentially on the substrate 1000. For example, the sacrificial layer 1100 may comprise SiGe (where an atomic percentage of Ge is about 15-30%, for example) with a thickness of about 10-50 nm, the sacrificial layers 1104 and 1108 may comprise SiGe (where an atomic percentage of Ge is about 15-30%, for example) with a thickness of about 5-10 nm, and the nanowire material layers 1102 and 1106 may comprise Si with a thickness of about 3-15 nm. It is to be noted that the materials and thickness of the respective sacrificial layers and nanowire material layers and also the number thereof may be selected by a skilled person in the art as desired, and that the respective sacrificial layers do not necessarily comprise the same material and the respective nanowire material layers do not necessarily comprise the same material.

In the substrate 1000, a well region 1000-1 may be formed by, for example, ion implantation. For example, the well region may be formed to have an n-type conductivity for a p-type device, or a p-type conductivity for an n-type device. The n-type well region may be formed by implanting n-type impurities such as P or As into the substrate 1000, and the p-type well region may be formed by implanting p-type impurities such as B into the substrate 1000. Annealing may be performed after the implantation if needed. There are various ways to form the n-type well or p-type well, and detailed descriptions thereof are omitted here.

On the stack, a stop layer 1006, a pattering auxiliary layer 1008 and a protection layer 1010 may be sequentially formed. The stop layer 1006 may comprise oxide (e.g., silicon oxide) with a thickness of about 5-25 nm, the pattering auxiliary layer 1008 may comprise amorphous silicon with a thickness of about 50-200 nm, and the protection layer 1010 may comprise nitride (e.g., silicon nitride) with a thickness of about 5-15 nm. The materials for those layers are selected to provide etching selectivity in later processes. It is to be understood by those skilled in the art that those layers may comprise other suitable materials, and that some of them may be even omitted in some cases.

Next, a photoresist layer 1012 may be formed on the protection layer 1010. The photoresist layer 1012 may be patterned by, e.g., photolithography, to form openings therein at positions corresponding to back gates to be formed. The openings each may have a width D of about 15-100 nm.

Figure 5:
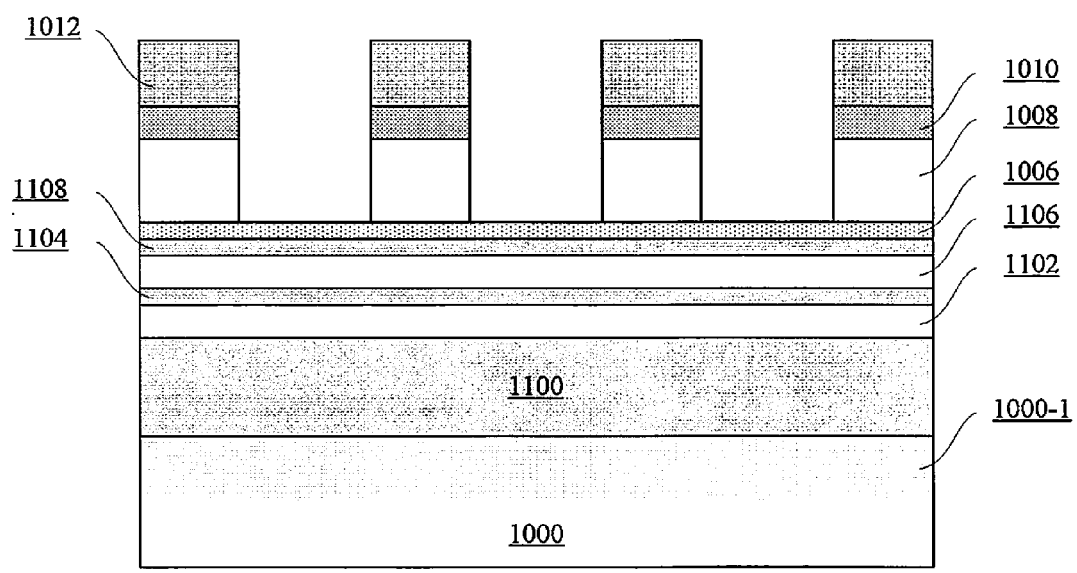

Then, as shown in FIG. 5, the protection layer 1010 and the patterning auxiliary layer 1008 may be sequentially etched by, e.g., Reactive Ion Etching (RIE), with the photoresist layer 1012 as a mask, to form openings in the protection layer 1010 and the patterning auxiliary layer 1008. The etching may stop on the stop layer 1006. If the patterning auxiliary layer 1008 and the underlying stack (specifically, the sacrificial layer 1108 in this example) have sufficient etching selectivity with respect to each other, the stop layer 1006 may be even omitted. Then, the photoresist layer 1012 may be removed.

Figure 6:
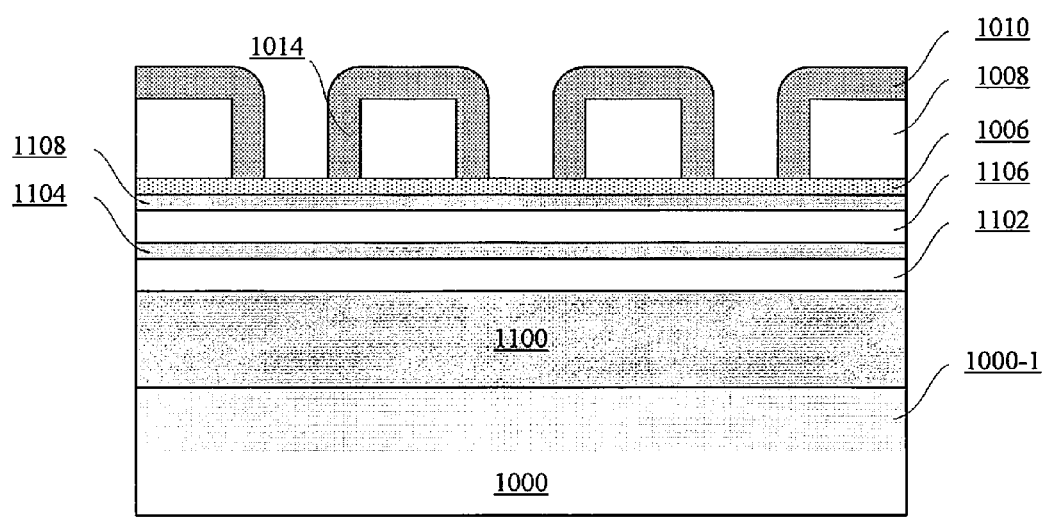

Then, as shown in FIG. 6, a pattern transfer layer 1014 may be formed on side walls of the patterning auxiliary layer 1008 (facing the openings). The pattern transfer layer 1014 may be formed in a spacer formation process. For example, a nitride layer may be deposited on a surface of the arrangement shown in FIG. 5 (with the photoresist layer 1012 removed), and then etched by RIE to form the pattern transfer layer as spacers. The deposited nitride layer may have a thickness of about 3-28 nm (which substantially determines a width of a nanowire to be formed). The deposition may comprise Atom Layer Deposition (ALD). There are various ways to form such spacers, and detailed descriptions thereof are omitted here.

Figure 7:
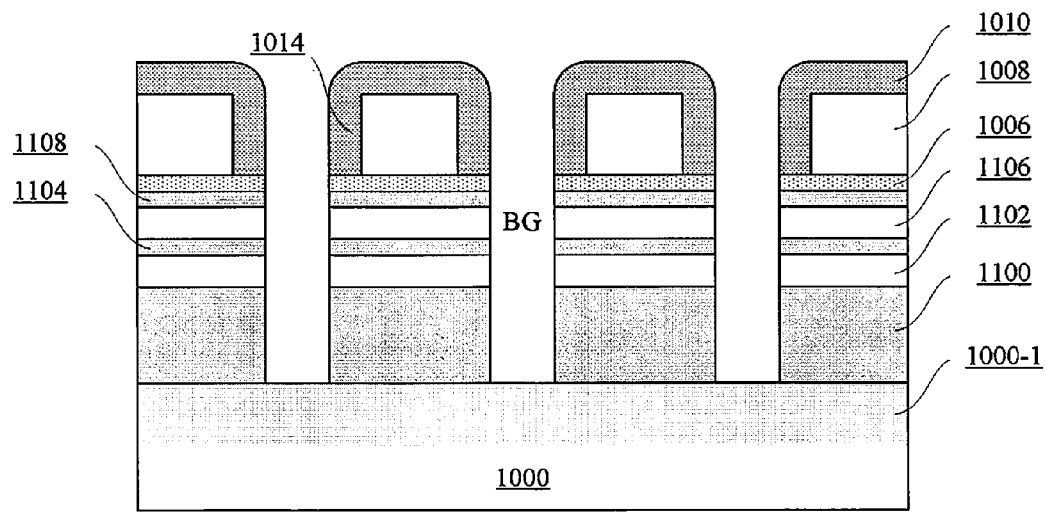

Next, as shown in FIG. 7, the stack may be patterned with the patterning auxiliary layer 1008 and the pattern transfer layer 1014 as a mask, to form back gate grooves BG therein. Here, the stop layer 1006, the sacrificial layer 1108, the nanowire material layer 1106, the sacrificial layer 1104, the nanowire material layer 1102, and the sacrificial layer 1100 may be sequentially etched by RIE, to form the back gate grooves BG. Here, the RIE may stop on the substrate 1000, and thus the resultant back gate grooves BG can access the well region 1000-1. Due to the presence of the protection layer 1010, the RIE has substantially no impact on the patterning auxiliary layer 1008. If the patterning auxiliary layer 1008 has sufficient etching selectivity with respect to the stop layer 1006, the sacrificial layer, the nanowire material layer, and the substrate 1000, the protection layer 1010 may be even omitted. In the example of FIG. 7, the etching of the back gate grooves stops on the substrate 1000. However, the present disclosure is not limited thereto. For example, the back gate grooves BG may enter inside the well region 1000-1.

Figure 8:
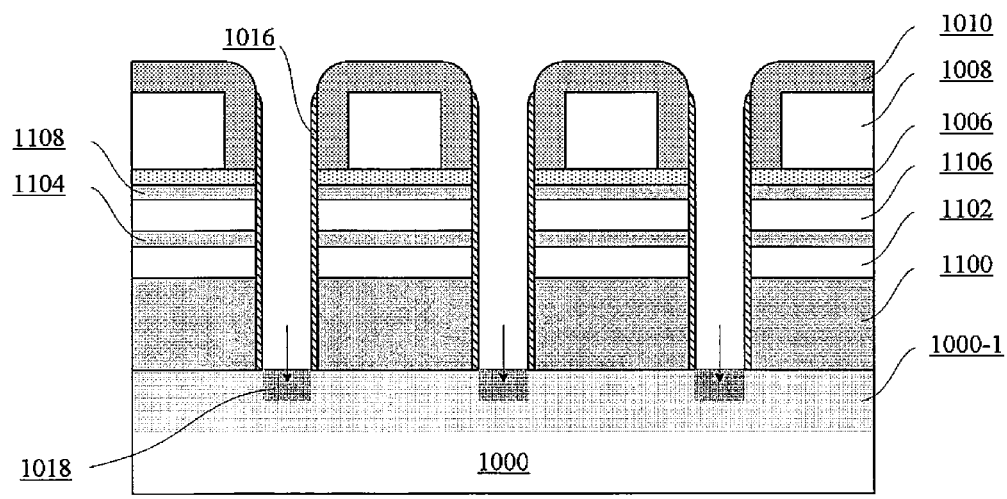

Subsequently, as shown in FIG. 8, back gate dielectric layers 1016 may be formed on side walls of the back gate grooves BG. The back gate dielectric layers 1016 may comprise any suitable dielectric material, for example, oxide or a high-K dielectric material such as $HfO_2$. Here, the back gate dielectric layers 1016 may be formed in a spacer formation process. For example, an oxide layer with an Equivalent Oxide Thickness (EOT) of about 2-30 nm may be formed on a surface of the arrangement of FIG. 7 by thermal oxidation, and then etched by RIE, to form the back gate dielectric layers as spacers.

Figure 9:
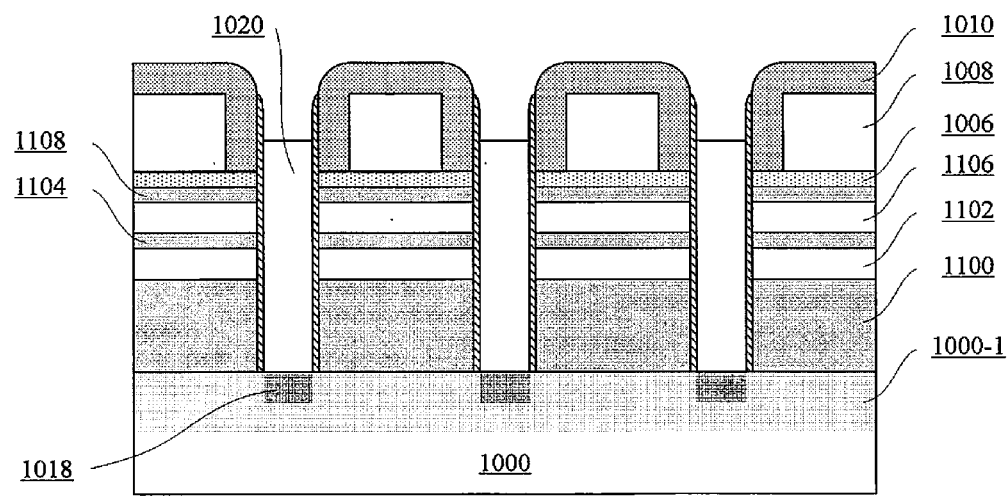

Here, to reduce a contact resistance between the back gates to be formed and the substrate, ion implantation may be performed through the back gate grooves BG, as shown by arrows in FIG. 8, to form contact regions 1018 in the substrate 1000 (especially, in the well region 1000-1). The ion implantation has the same doping polarity as the well region, and thus the contact regions 1018 may have a greater doping concentration (e.g., 1E18-1E21 $cm^{-3}$) than that of the well region 1000-1. Then, as shown in FIG. 9, a conductive material may be filled into the back gate grooves BG, to form the back gates 1020. The back gates 1020 may comprise doped (and thus conductive) semiconductor, such as polysilicon, in a conductively (p-type or n-type) selected to adjust a threshold voltage and at a concentration of about 1E18-1E21 cm$^{-3}$. The filling may be done by depositing and then etching back the conductive material, for example. The back gates 1020 may have their top surfaces higher than a top surface of the stack of the sacrificial layers and the nanowire material layers. Alternatively, the back gates 1020 may comprise metal, such as, TiN, W, or a combination thereof.

After the back gates are formed as described above, the stack of the sacrificial layers and the nanowire material layers may be patterned to form the nanowires.

Figure 10:
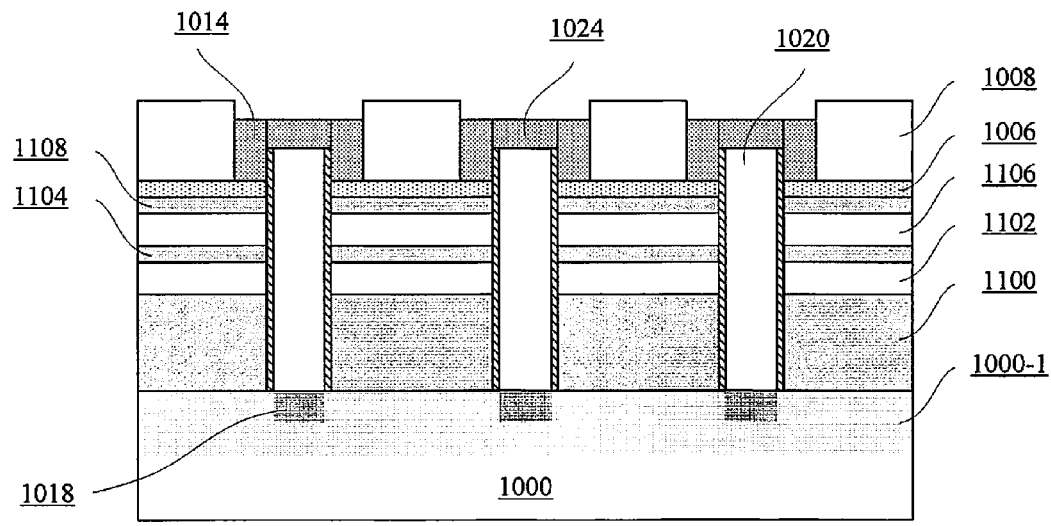

In this embodiment, SNFETs with a gate stack intersecting the nanowires are to be formed. To avoid interference between the back gates 1020 and the gate stack, a dielectric layer 1024 may be further filled into the back gate grooves BG to cover the back gates 1020, as shown in FIG. 10. For example, the dielectric layer 1024 may comprise nitride, and may be formed by depositing and then etching back a nitride layer. During the etching back, the protection layer 1010 on top of the patterning auxiliary layer 1008 may be removed, to expose the patterning auxiliary layer 1008, as shown in FIG. 10. Here, before filling the dielectric layer 1024, portions of the back gate dielectric layers 1016 beyond the top surfaces of the back gates 1020 may be removed.

Figure 11:
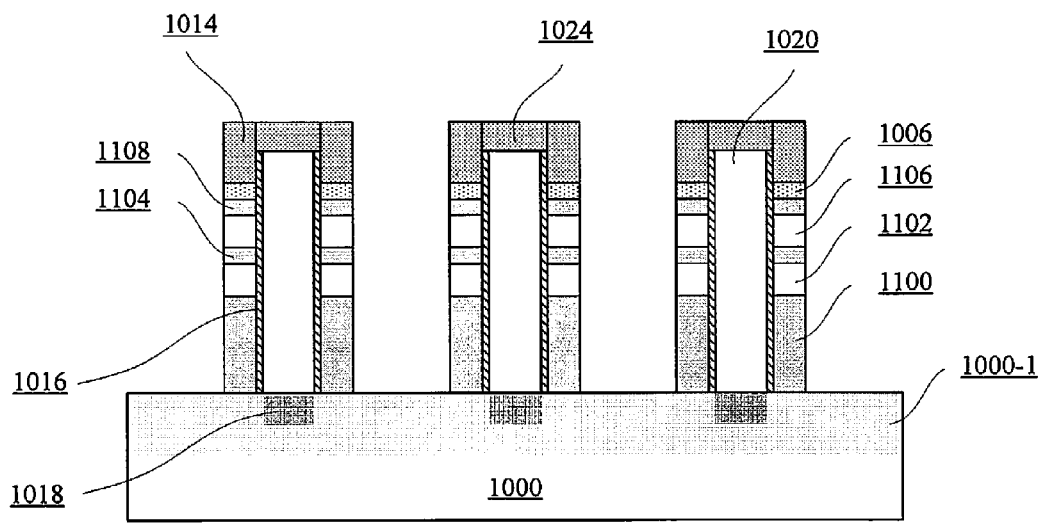

Next, as shown in FIG. 11, the patterning auxiliary layer 1008 may be removed by selective etching, for example, wet etching with TMAH solution, to leave the pattern transfer layer 1014. Then, the stop layer 1006 and the stack of the sacrificial layers and the nanowire material layers may be selectively etched by, e.g., RIE, with the pattern transfer layer 1014 as a mask. As a result, wire-like portions of the sacrificial layers and the nanowire material layers are left on opposite sides of the respective back gates 1020. Those wire-like portions correspond to the pattern transfer layer 1014 in shape. Here, the RIE of the sacrificial layers and the nanowire material layers may stop on the substrate 1000.

Figure 12:
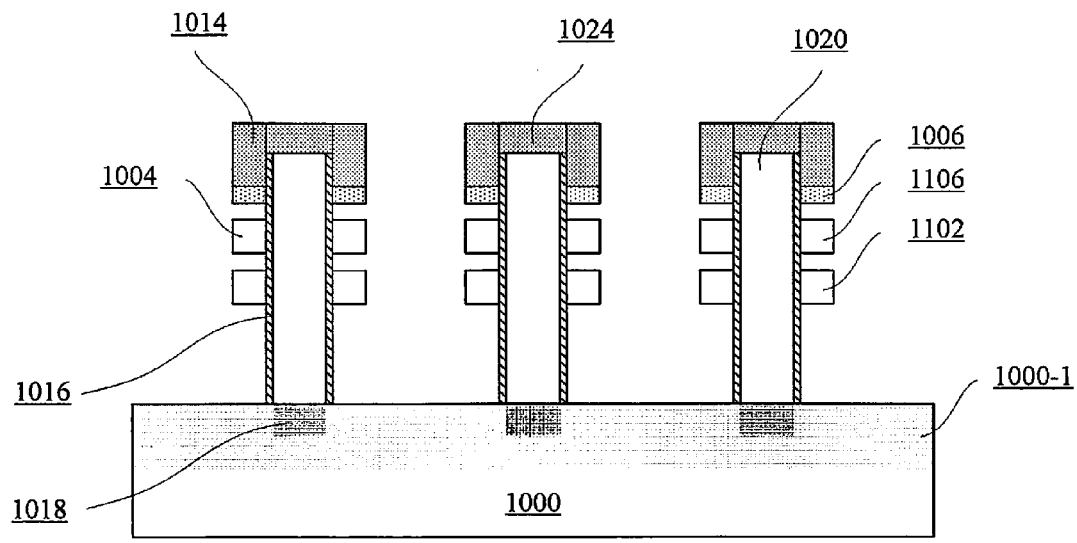

Then, as shown in FIG. 12, the sacrificial layers 1100, 1104, and 1108 (e.g., SiGe) may be selectively removed with respect to the substrate 1000 (e.g., Si) and the nanowire material layers 1102 and 1106 (e.g., Si), resulting in an SN configuration according to this embodiment. As shown in FIG. 12, the SN configuration comprises the back gate 1020 and pairs of the nanowires 1004 on opposite sides of the back gate 1020, with the back gate dielectric layers 1016 interposed between the back gate 1020 and the respective nanowires 1004.

In the SN configuration shown in FIG. 12, remaining portions of the pattern transfer layer 1014 and the stop layer 1006 are also shown. Those remaining portions have no essential impacts on subsequent processes, and thus can be left as they are for simplification. Certainly, they can be removed as desired.

After the SNs are formed as described above, various devices may be formed based on the SNs. In the example shown in FIG. 12, there are three SNs. However, the present disclosure is not limited thereto. For example, more or less SNs may be formed as desired, and the SNs may be formed in a different layout than that shown in the figures where the SNs are disposed in parallel.

In the following, an exemplary flow of making SNFETs will be described.

Figure 13:
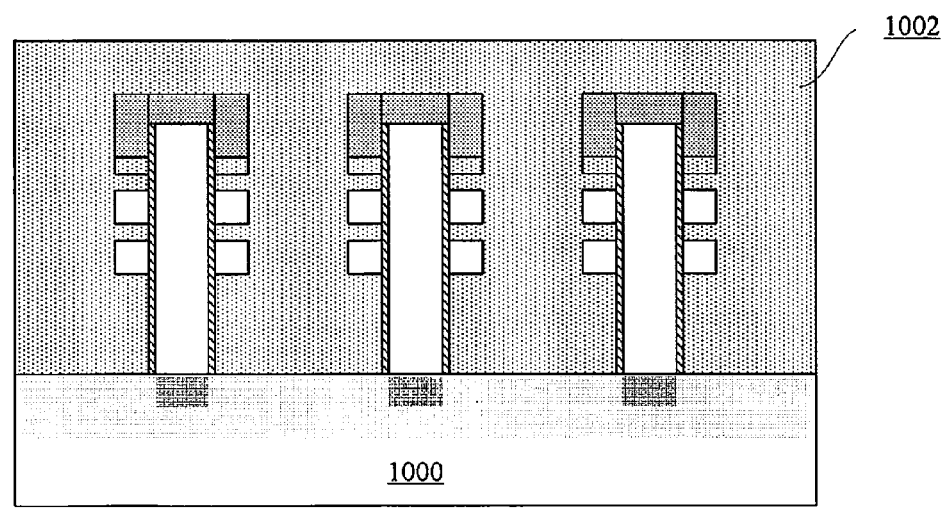
Figure 14:
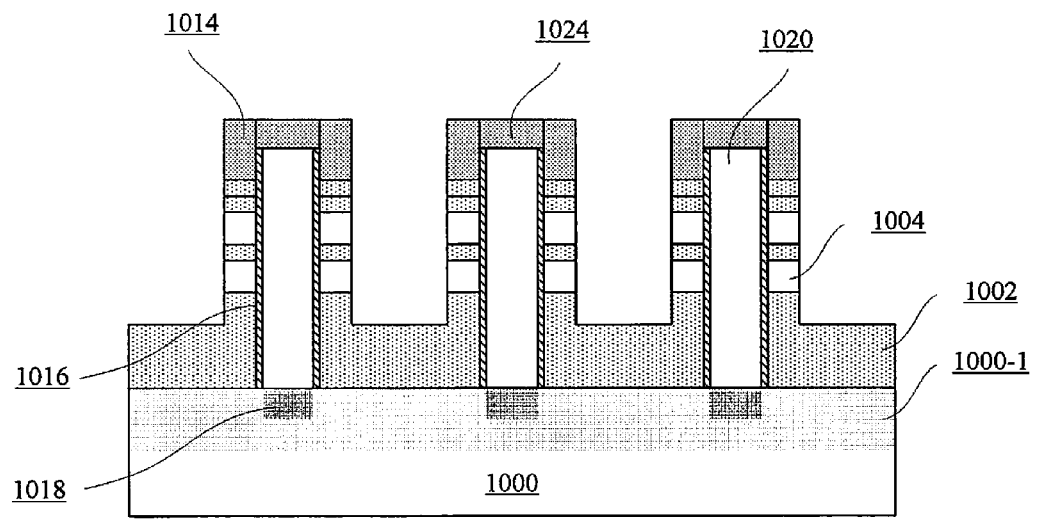

To make the SNFETs, an isolation layer may be formed on the substrate 1000. For example, as shown in FIG. 13, a dielectric layer 1002 (comprising, e.g., oxide) may be formed on the substrate by means of, e.g., deposition. Generally, the deposited dielectric layer may completely cover the SNs, and then planarized by, e.g., Chemical Mechanical Polishing (CMP). In an example, the deposited dielectric layer may be planarized by sputtering. The sputtering may use plasma, such as Ar or N plasma. Then, as shown in FIG. 14, the deposited dielectric layer may be etched back by, e.g., RIE, to form the isolation layer 1002. Here, the isolation layer 1002 may have a thickness of about 30-70 nm to expose the nanowires 1004. Further, portions of the dielectric layer 1002 may fill on upper/lower surfaces of the nanowires 1004.

Figure 15:
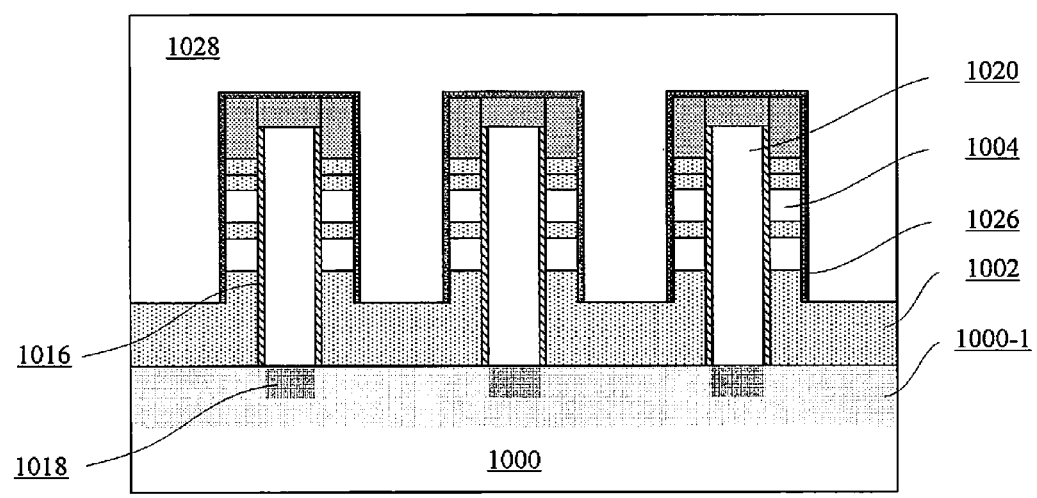

Next, a gate stack may be formed on the isolation layer 1002 to intersect the SNs. For example, this can be done as follows. Specifically, as shown in FIG. 15, a gate dielectric layer 1026 may be formed by, e.g., deposition. For example, the gate dielectric layer 1026 may comprise oxide, with a thickness of about 0.8-1.5 nm. In the example shown in FIG. 15, the dielectric layer 1026 is shown to be in a Π shape. However, the dielectric layer 1026 may extend onto a top surface of the isolation layer 1002. Then, a gate conductor layer 1028 may be formed by, e.g., deposition. For example, the gate conductor layer 1028 may comprise polysilicon. The gate conductor layer 1028 may fill gaps between the SNs, and then planarized by, e.g., CMP.

Figure 16:
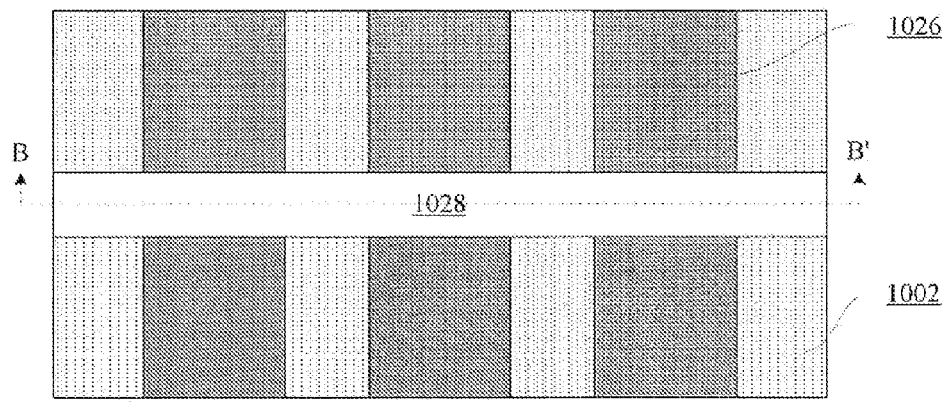
Figure 16:
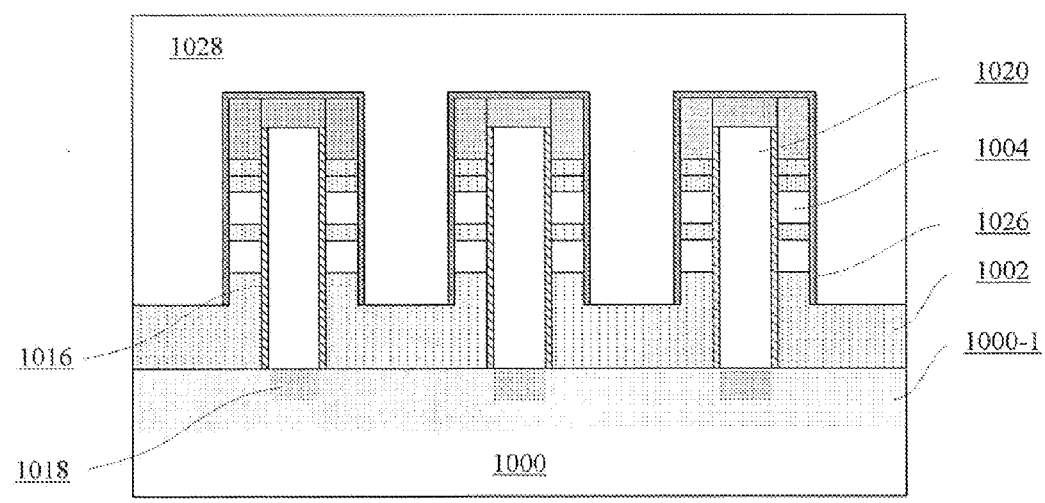

As shown in FIG. 16 (where FIG. 16(*b*) is a sectional view taken along BB' in FIG. 16(*a*)), the gate conductor layer 1028 may be patterned. In the example shown in FIG. 16, the gate conductor layer 1028 may be patterned to a bar crossing the SNs. According to a further embodiment, the gate dielectric layer 1026 may be further patterned with the patterned gate conductor layer 1028 as a mask.

After formation of the patterned gate conductor, halo implantation and extension implantation may be carried out with the gate conductor as a mask.

Figure 17:
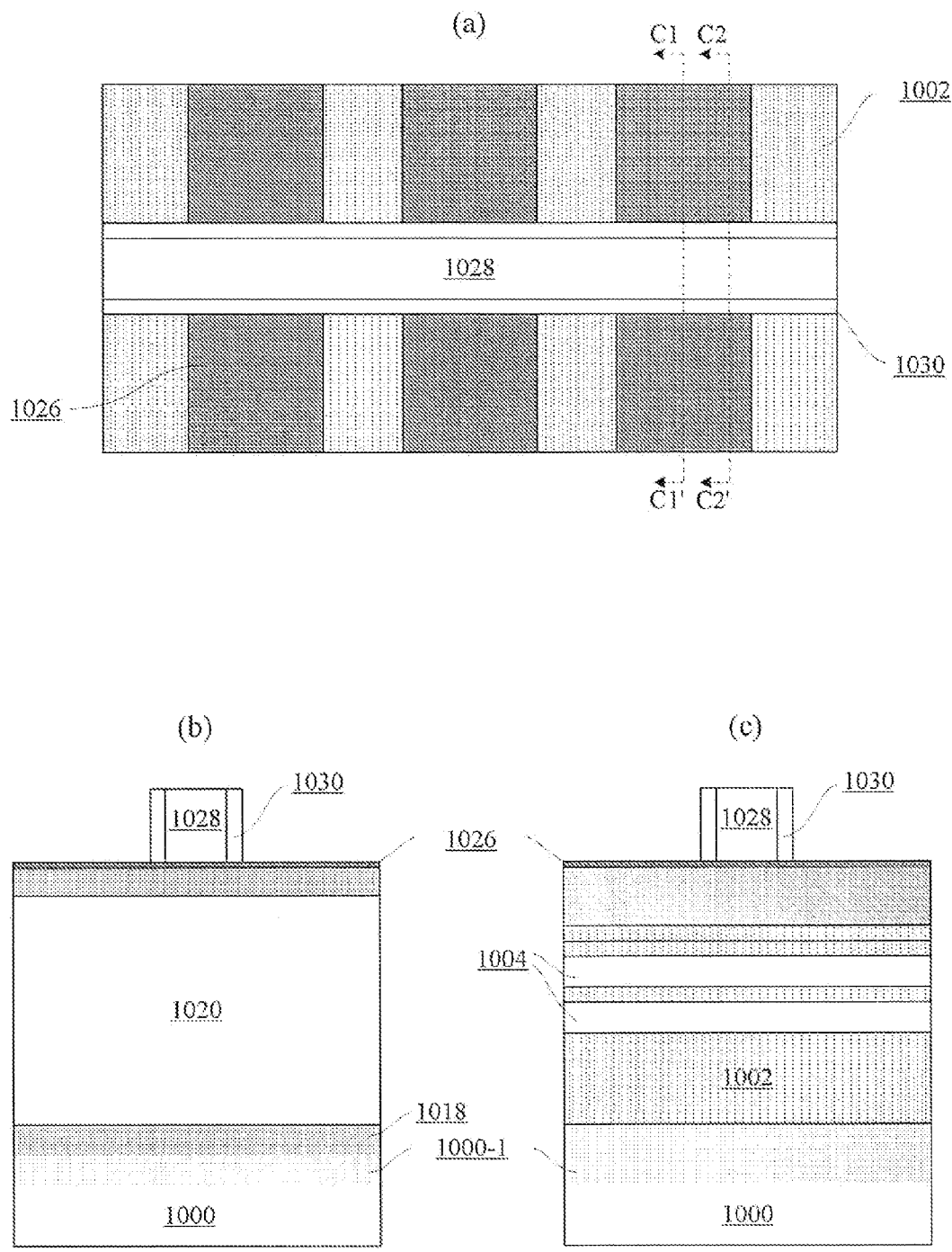

Next, as shown in FIG. 17 (where FIG. 17(*b*) is a sectional view taken along C1C1' in FIG. 17(*a*), and FIG. 17(*c*) is a sectional view taken along C2C2' in FIG. 17(*a*)), gate spacers 1030 may be formed on side walls of the gate conductor layer 1028. For example, a nitride layer (e.g., silicon nitride) with a thickness of about 5-20 nm may be deposited and then etched by RIE, to form the spacers 1030. Here, the amount of RIE may be controlled in forming the gate spacers, so that the gate spacers 1030 have substantially no portions on the side walls of the SNs. There are various ways to form the spacers, and detailed descriptions thereof are omitted here.

After formation of the spacers, source/drain (S/D) implantation may be carried out with the gate conductor and the spacers as a mask. Then, annealing may be performed to activate implanted ions to form S/D regions, resulting in SNFETs.

Figure 18:
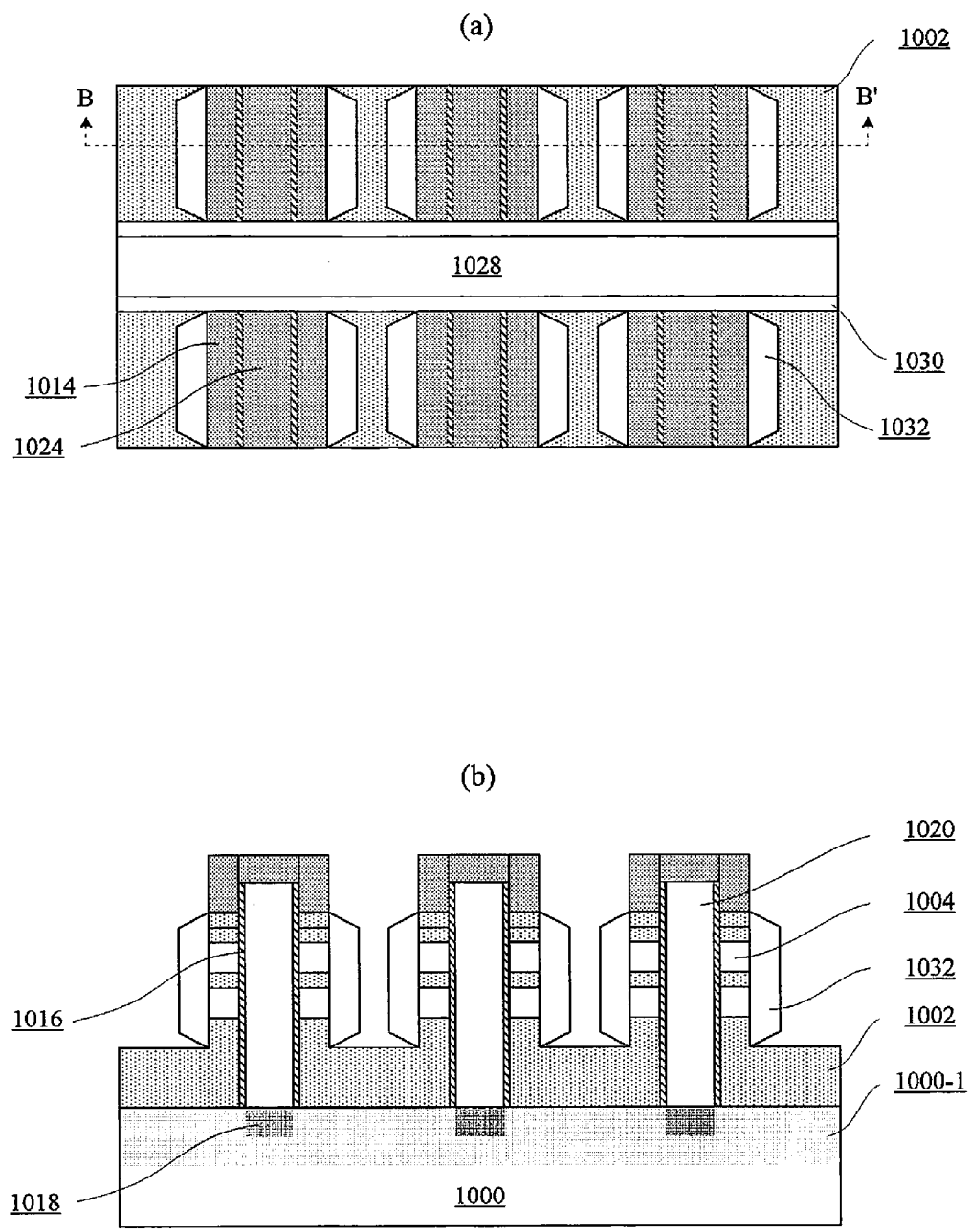

To improve the device performances, in an example, strained S/D technology may be utilized. Specifically, as shown in FIG. 18 (where FIG. 18(*b*) is a sectional view taken along BB' in FIG. 18(*a*)), portions of the gate dielectric layer 1026 exposed by the gate conductor may be removed to expose portions (corresponding to the S/D regions) of the nanowires 1004 (which operation can be omitted if the gate dielectric layer 1026 is also patterned in the patterning of the gate stack). On surfaces of the exposed portions of the nanowires, a semiconductor layer 1032 may be formed by epitaxy. In an example, the semiconductor layer 1032 may be doped in-situ during the epitaxy. For example, the semiconductor layer 1032 may be n-type doped in-situ for an n-type device, or p-type doped in situ for a p-type device. To further improve the device performances, the semiconductor layer 1032 may comprise a different material from the nanowires 1004, to apply stress to the nanowires 1004 (where the channel regions are to be formed). For example, in a case where the nanowires 1004 comprise Si, the semiconductor layer 1032 may comprise Si:C (where an atomic percentage of C may be about 0.2-2%, for example) for an n-type device to apply tensile stress, or SiGe (where an atomic percentage of Ge may be about 15-75%, for example) for a p-type device to apply compressive stress. On the other hand, the grown semiconductor layer 1032 extends laterally to an extent, facilitating formation of contacts to the S/D regions.

In a case where the gate conductor layer 1028 comprises polysilicon, growth of the semiconductor layer 1032 may also occur on the gate conductor layer 1028. This is not shown in the figure.

In the above embodiment, the gate stack is directly formed after formation of the SNs. However, the present disclosure is not limited thereto. For example, a gate last process is also applicable.

According to another embodiment of the present disclosure, the gate dielectric layer 1026 and the gate conductor layer 1028 shown in FIG. 15 are a sacrificial gate dielectric layer and a sacrificial gate conductor layer, respectively. (In this case, operations described with reference to FIGS. 15 and 16 result in a sacrificial gate stack.) Next, the gate spacers 1030 may be formed in the same way as described above with reference to FIG. 17. Likewise, the strained S/D technology may be also applied as described with reference to FIG. 18.

Then, the sacrificial gate stack may be handled according to the gate last process to form a real gate stack. For example, this can be done as follows.

Figure 19:
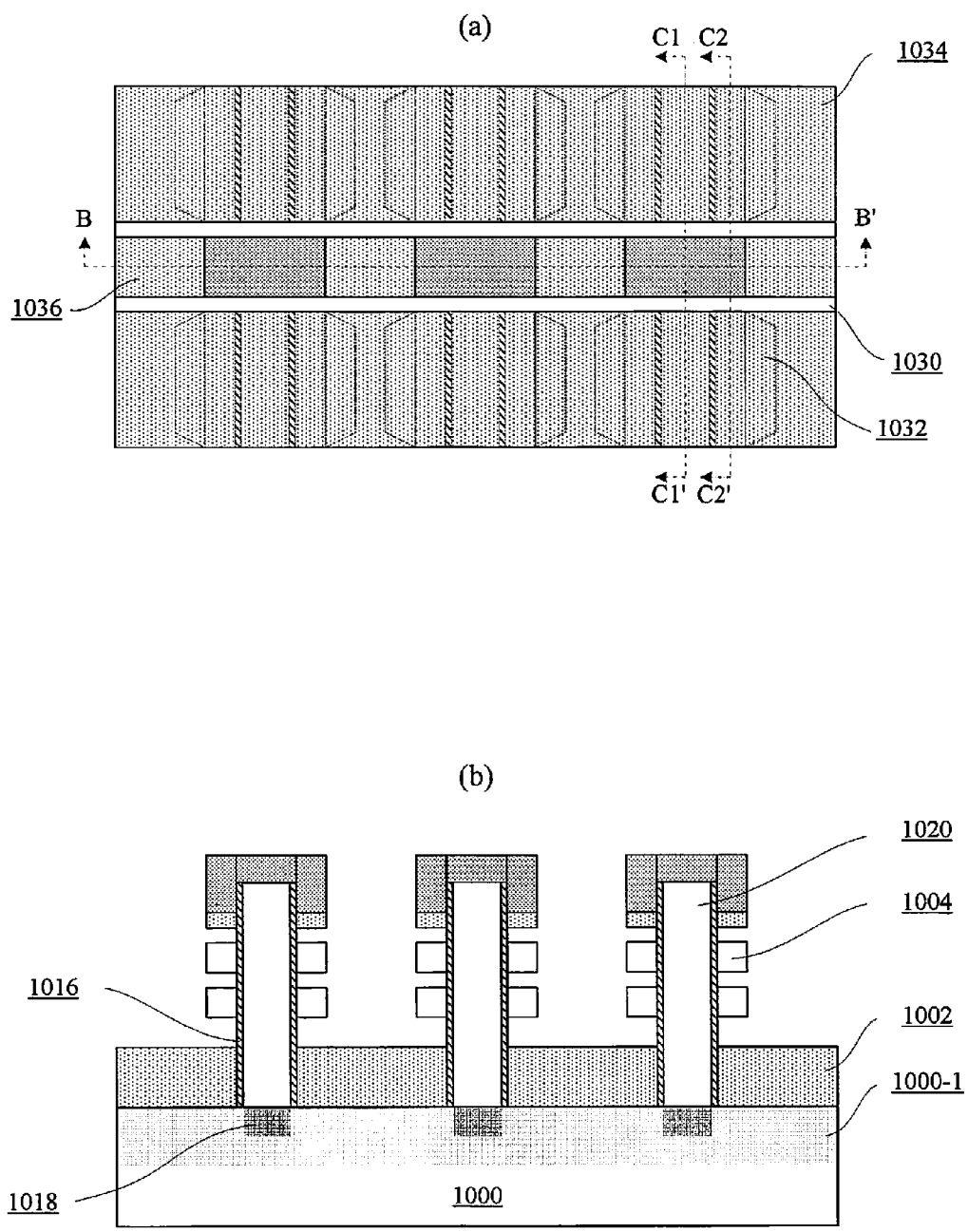
Figure 19:
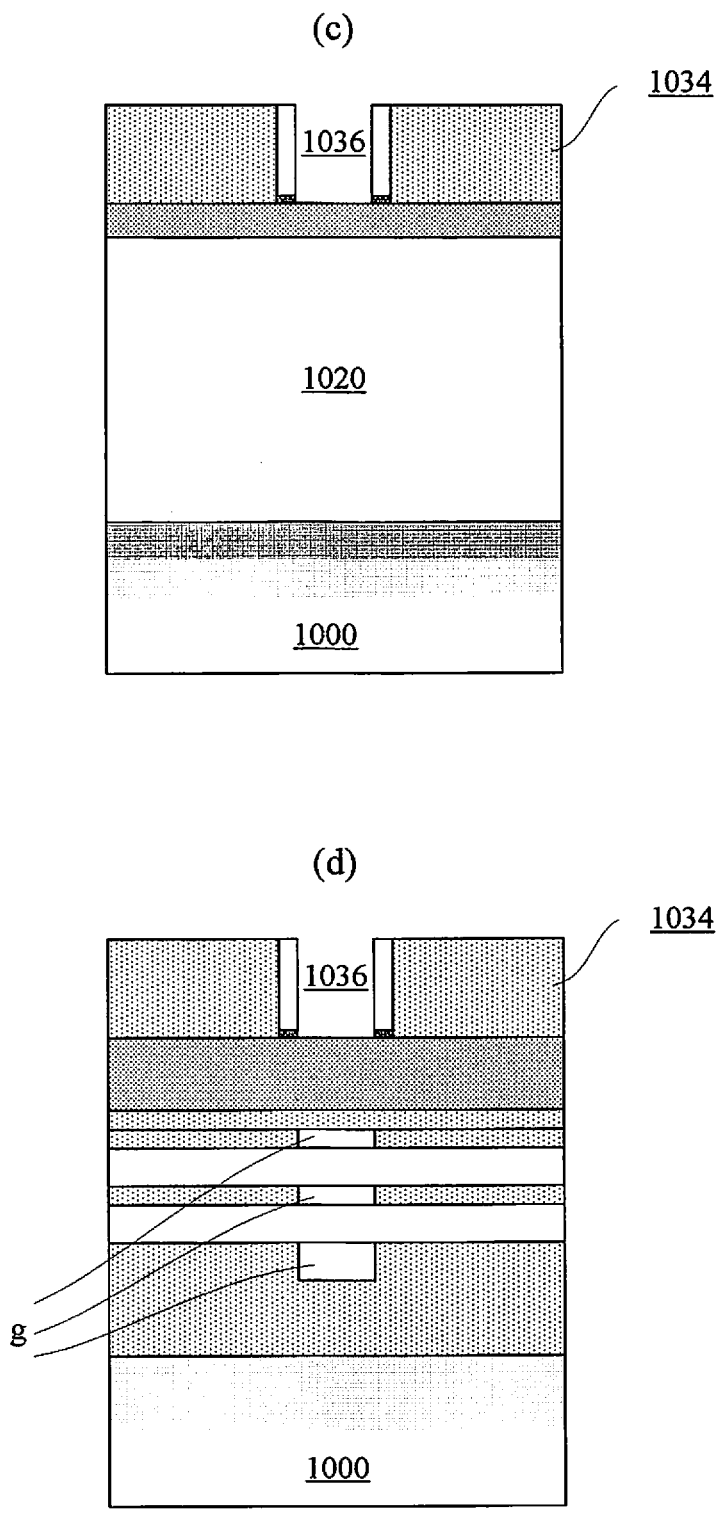

Specifically, as shown in FIG. 19 (where FIG. 19(*b*) is a sectional view taken along BB' in FIG. 19(*a*), FIG. 19(*c*) is a sectional view taken along C1C1' in FIG. 19(*a*), and FIG. 19(*d*) is a sectional view taken along C2C2' in FIG. 19(*a*)), a dielectric layer 1034 may be formed by, e.g., deposition. The dielectric layer 1034 may comprise oxide. Then, the dielectric layer 1034 may be planarized by, e.g., CMP. The CMP may stop at the gate spacers 1030, and thus the sacrificial gate conductor layer 1028 is exposed. Next, the sacrificial gate conductor layer 1028 may be selectively removed by means of, e.g., TMAH solution, and the sacrificial gate dielectric layer 1026 may be further removed, leaving a gate groove 1036 between the gate spacers 1030.

Then, portions of the isolation layer present on the surfaces (specifically, the upper and lower surfaces in this example) of the nanowires 1004 may be etched away through the gate groove 1036, to expose those surfaces. Due to this operation, gaps g are left at the surfaces of the nanowires 1004, as shown in FIG. 19(*d*). Though in this example the gaps g are shown to be located directly under the gate groove 1036, they can extend further laterally depending on the etching amount.

Figure 20:
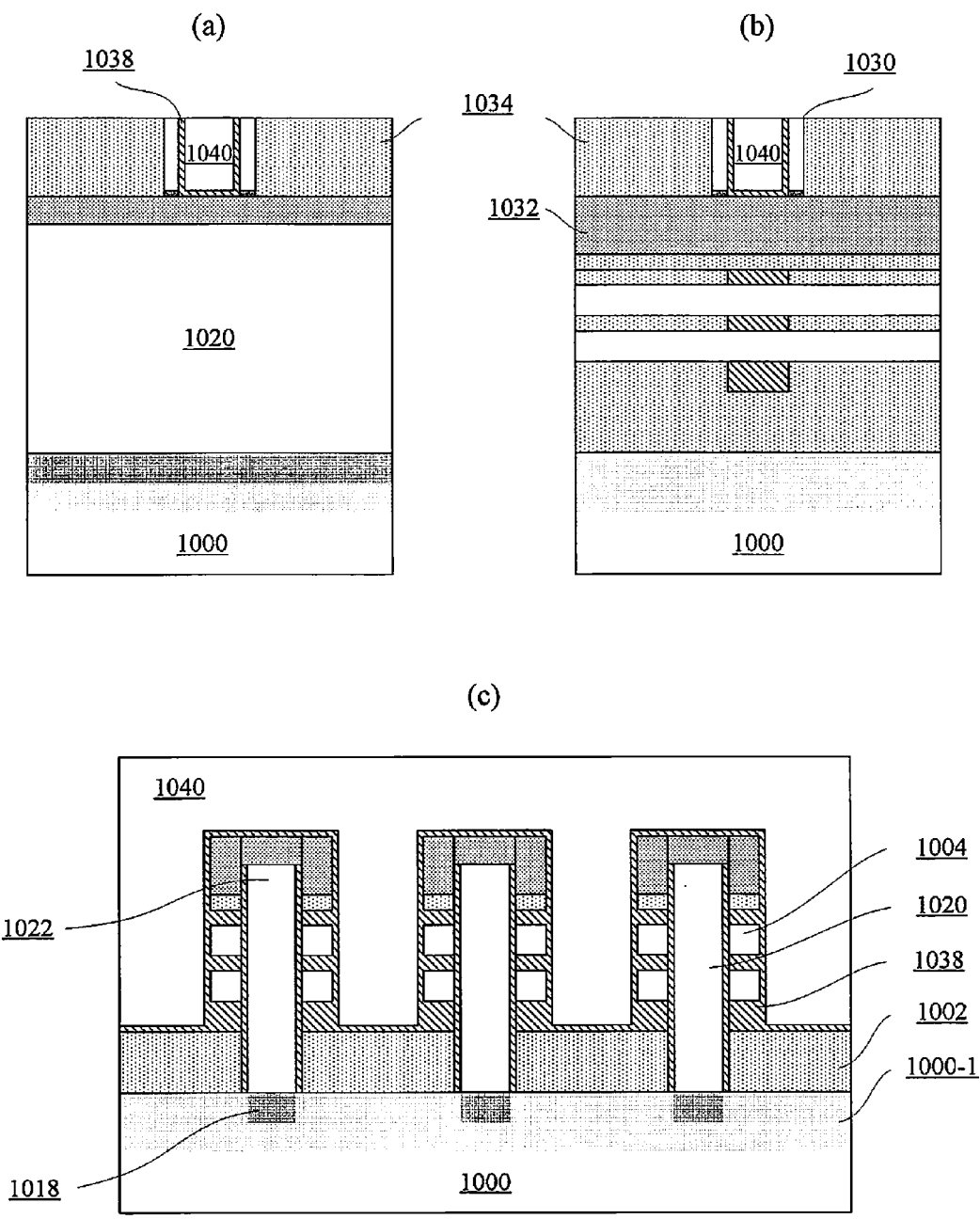
Figure 21:
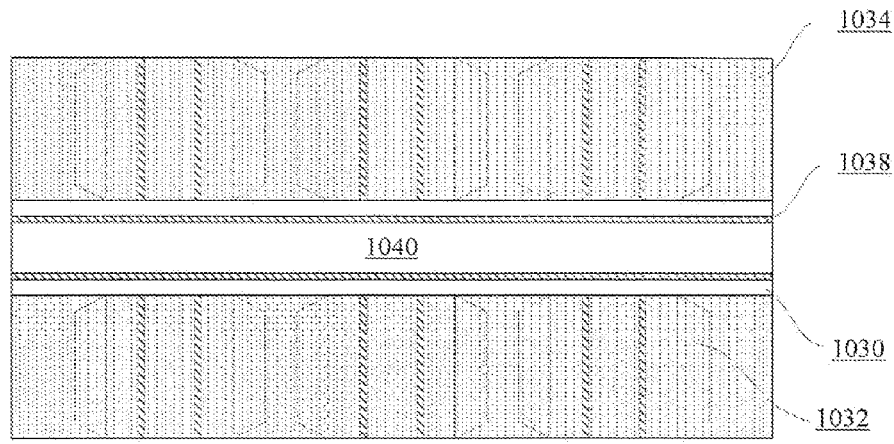

Then, as shown in FIG. 20 (where FIG. 20(*a*) is a sectional view corresponding to that of FIG. 19(*c*), FIG. 20(*b*) is a sectional view corresponding to that of FIG. 19(*d*), and FIG. 20(*c*) is a sectional view corresponding to that of FIG. 19(*a*)) and FIG. 21 (which is a top view showing the arrangement of FIG. 20), a real gate stack may be formed by forming a gate dielectric layer 1038 and a gate conductor layer 1040 in the gate groove. The gate dielectric layer 1038 may comprise a high-K gate dielectric material such as $HfO_2$, with a thickness of about 1-5 nm. Further, the gate dielectric layer 1038 may further comprise a thin oxide layer (on which the high-K gate dielectric is disposed), with a thickness of about 0.3-1.2 nm. The gate conductor layer 1040 may comprise a metal gate conductor. There may be a work function adjustment layer (not shown) interposed between the gate dielectric layer 1038 and the gate conductor layer 1040.

Here, because the gaps g each have a relatively small height (which is determined substantially by the thickness of the respective sacrificial layers), the gate dielectric layer 1038 substantially fills each of the gaps g up. Therefore, the gate conductor layer 1040 extends substantially on the surfaces of the nanowires 1004 opposite to the back gate 1020, and thus can control generation of conductive channels on those surfaces via the gate dielectric layer 1038.

Thus, the SNFETs according to this embodiment are achieved. As shown in FIGS. 20 and 21, the SNFET comprises the gate stack (including the gate dielectric layer 1038 and the gate conductor layer 1040) formed on the substrate 1000 (specifically, the isolation layer 1002) and intersecting the SN (including the back gate 1020 and the nanowires 1004). As clearly shown in FIG. 20(*c*), the gate conductor layer 1040 may control generation of conductive channels on the surfaces (opposite to the back gate 1020) of each of the nanowires 1004 via the gate dielectric layer 1038. Further, the back gate 1020 may control the nanowires 1004 via the respective back gate dielectric layers 1016, and thus adjust the threshold of the SNFET as desired. The back gate 1020 is electrically isolated from the gate stack by the dielectric layer 1024.

Figure 22:
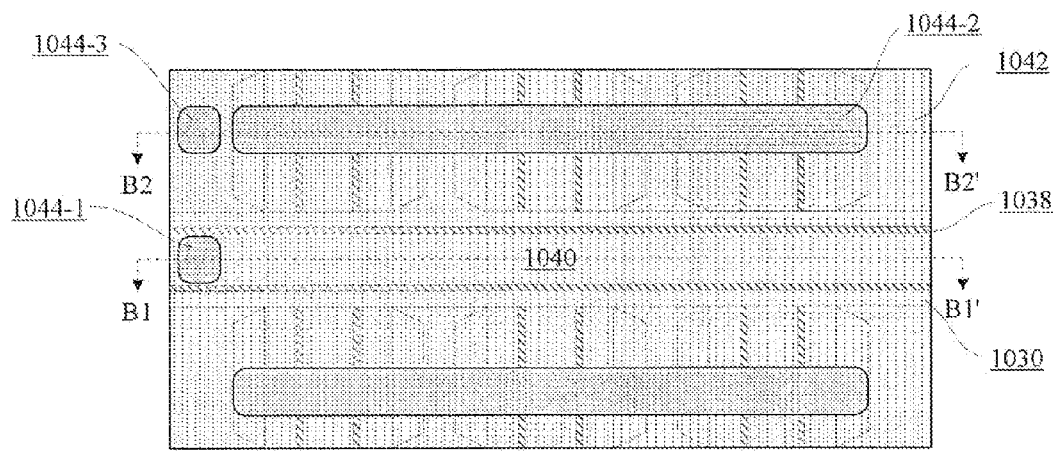

After formation of the SNFETs, various electrical contacts may be formed. For example, as shown in FIG. 22, an Interlayer Dielectric (ILD) layer 1042 may be formed on a surface of the arrangement of FIG. 21. The ILD layer 1042 may comprise oxide. The ILD layer 1042 may be planarized by, e.g., CMP, to have a substantially planar surface. Then, contact holes may be formed by means of, e.g., photolithography, and then filled by a conductive material, e.g., metal (such as W, Cu, or the like), to form contacts, such as a contact 1044-1 to the gate stack, contacts 1044-2 to the S/D regions, and a contact 1044-3 to the back gate.

Figure 23:
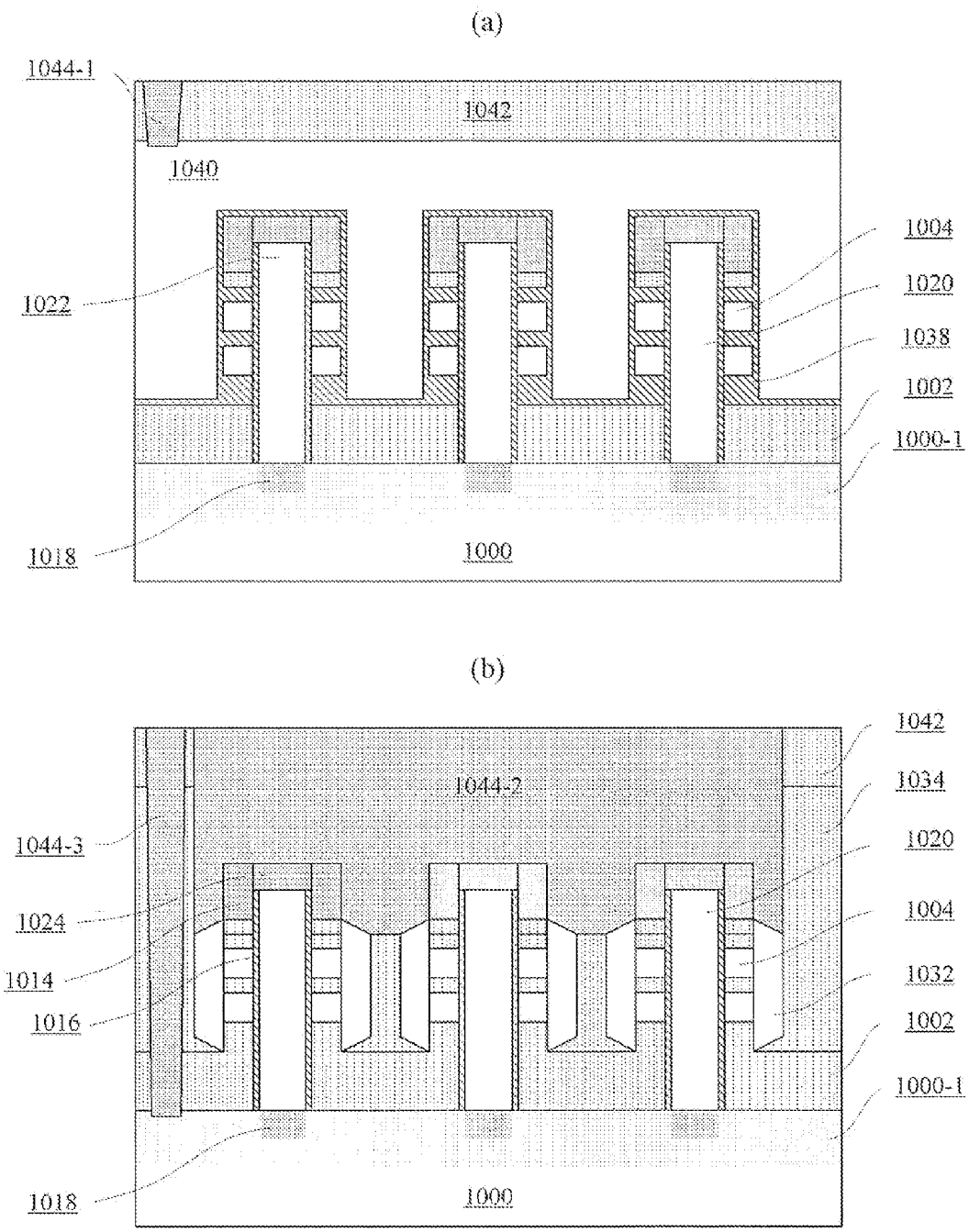

FIG. 23 shows sectional views taken along B1B1' and B2B2' of FIG. 22 in (a) and (b), respectively. As shown in FIG. 23, the contact 1044-1 passes through the ILD layer 1042, and accesses and thus is in electrical contact with the gate conductor 1040; the contacts 1044-2 pass through the ILD layer 1042 and the dielectric layer 1034, and access and thus are in electrical contact with the S/D regions (the semiconductor layer 1032 in this example); and the contact 1044-3 passes through the ILD layer 1042, the dielectric layer 1034, and the isolation layer 1002, and accesses the substrate 1000 (especially, the well region 1000-1) and thus is in electrical contact with the back gate 1020. Desired electrical signals may be applied through those electrical contacts.

In FIG. 23, the source or drain regions of the three SNFETs are shown to be connected to the same contact. However, the present disclosure is not limited thereto. Different connections can be made based on different designs.

Figure 24:
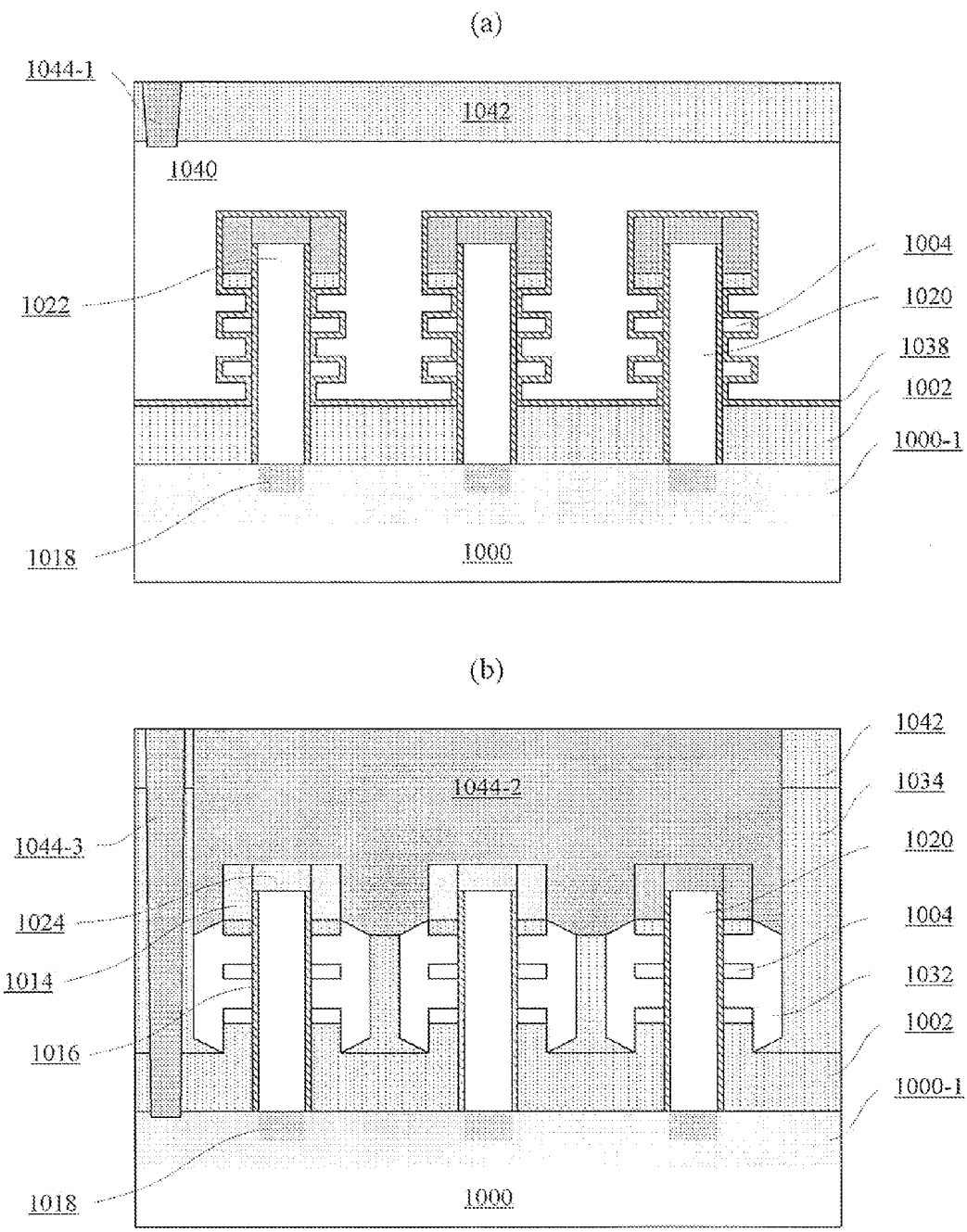
FIG. 24 is a sectional view showing a semiconductor arrangement according to a further embodiment of the present disclosure.

FIG. 24 is a sectional view showing a semiconductor arrangement according to a further embodiment of the present disclosure. Like components in FIG. 24 are denoted by like reference symbols as in FIG. 23. The semiconductor arrangement shown in FIG. 24 differs from that shown in FIG. 23 mainly in that: the gate conductor 1040 further extends onto the upper and lower surfaces of the nanowires 1004, and thus can control generation of conductive channels on the upper and lower surfaces of the nanowires 1004 via the gate dielectric layer 1038. The semiconductor arrangement shown in FIG. 24 may be manufactured by the processes described above with reference to FIGS. 4-23, with the thickness of the sacrificial layers 1104 and 1108 increased (to, e.g., about 7-15 nm). Further, before growing the semiconductor layer 1032 as described with reference to FIG. 18, portions of the isolation layer present on the surfaces (the upper and lower surfaces in this example) of the nanowires 1004 may be selectively removed, to expose those surfaces. Then, as shown in FIG. 24(*b*), the semiconductor layer 1032 may be also grown on the upper and lower surfaces of the nanowires 1004.

In the above descriptions, details of patterning and etching of the layers are not described. It is to be understood by those skilled in the art that various measures may be utilized to form the layers and regions in desired shapes. Further, to achieve the same feature, those skilled in the art can devise processes not entirely the same as those described above. The mere fact that the various embodiments are described separately does not mean that means recited in the respective embodiments cannot be used in combination to advantage.

From the foregoing, it will be appreciated that specific embodiments of the disclosure have been described herein for purposes of illustration, but that various modifications may be made without deviating from the disclosure. In addition, many of the elements of one embodiment may be combined with other embodiments in addition to or in lieu of the elements of the other embodiments. Accordingly, the technology is not limited except as by the appended claims.

I claim:

1. A semiconductor arrangement, comprising:
   a substrate;
   a back gate formed on the substrate;
   at least one pair of nanowires disposed on the back gate, each pair of the at least one pair of nanowires including two nanowires, a first nanowire of the two nanowires extending in a first direction on a first side of the back gate, a second nanowire of the two nanowires extending in the first direction on a second side of the back gate, the second side of the back gate being opposite the first side of the back gate;
   back gate dielectric layers interposed between the back gate and the respective nanowires; and
   a gate stack extending in a second direction crossing the first direction to intersect the nanowires.

2. The semiconductor arrangement according to claim 1, wherein the nanowires each comprise Si, Ge, SiGe, GaAs, GaSb, AlAs, InAs, InP, GaN, SiC, InGaAs, InSb, or InGaSb, and has a height of about 3-15 nm and a width of about 3-28 nm.

3. The semiconductor arrangement according to claim 1, wherein the nanowires are configured not to extend beyond the back gate in a height direction of the back gate.

4. The semiconductor arrangement according to claim 1, wherein the back gate comprises at least one of doped polysilicon, TiN, or W, with a width of about 5-30 nm.

5. The semiconductor arrangement according to claim 1, wherein the gate dielectric layers each comprise oxide, with an equivalent oxide thickness of about 2-30 nm.

6. The semiconductor arrangement according to claim 1, further comprising:
   an isolation layer formed on the substrate and exposing the respective nanowires, wherein
   the gate stack is formed on the isolation layer and also intersects the back gate, wherein the gate stack is isolated from the back gate by a dielectric layer.

7. The semiconductor arrangement according to claim 6, wherein the gate stack comprises a gate dielectric layer and a gate conductor layer formed on the gate dielectric layer, wherein the gate conductor layer extends on side surfaces of the respective nanowires opposite to the back gate.

8. The semiconductor arrangement according to claim 7, wherein the gate conductor layer further extends onto surfaces of the respective nanowires in a height direction of the back gate.

9. The semiconductor arrangement according to claim 6, further comprising a semiconductor layer grown on surfaces of portions of each of the nanowires on opposite sides of the gate stack.

10. The semiconductor arrangement according to claim 9, wherein the semiconductor layer is compressively stressed if the semiconductor arrangement is used for a p-type device, or is tensilely stressed if the semiconductor arrangement is used for an n-type device.

11. The semiconductor arrangement according to claim 1, further comprising a well region in the substrate, wherein the back gate is in electrical contact with the well region.

12. The semiconductor arrangement according to claim 1, further comprising a source region and a drain region respectively formed on opposite ends of each of the nanowires in the first direction.

* * * * *